US010042971B1

(12) United States Patent
Eslami Dehkordi et al.

(10) Patent No.: US 10,042,971 B1
(45) Date of Patent: Aug. 7, 2018

(54) PLACEMENT AND ROUTING OF CLOCK SIGNALS FOR A CIRCUIT DESIGN

(71) Applicant: Xilinx, Inc., San Jose, CA (US)

(72) Inventors: Mehrdad Eslami Dehkordi, Los Gatos, CA (US); Raoul Badaoui, San Jose, CA (US); Marvin Tom, Cupertino, CA (US); Sridhar Krishnamurthy, San Jose, CA (US)

(73) Assignee: XILINX, INC., San Jose, CA (US)

( * ) Notice: Subject to any disclaimer, the term of this patent is extended or adjusted under 35 U.S.C. 154(b) by 76 days.

(21) Appl. No.: 15/210,756

(22) Filed: Jul. 14, 2016

(51) Int. Cl.
*G06F 17/50* (2006.01)

(52) U.S. Cl.
CPC ...... *G06F 17/5077* (2013.01); *G06F 17/5072* (2013.01); *G06F 2217/62* (2013.01)

(58) Field of Classification Search
CPC ............. G06F 17/5077; G06F 17/5072; G06F 17/5054; G06F 2217/62
USPC ........... 716/130, 131, 129, 116, 117; 703/15
See application file for complete search history.

(56) References Cited

U.S. PATENT DOCUMENTS

| | | | |
|---|---|---|---|
| 6,429,698 B1 | 8/2002 | Young | |
| 6,440,780 B1* | 8/2002 | Kimura | G06F 17/505 438/129 |
| 6,472,909 B1 | 10/2002 | Young | |
| 7,536,666 B1 | 5/2009 | Lee et al. | |
| 9,135,375 B1* | 9/2015 | Sood | G06F 17/50 |
| 9,330,220 B1* | 5/2016 | Dehkordi | G06F 17/5072 |
| 2001/0047450 A1* | 11/2001 | Gillingham | G06F 13/1689 711/105 |
| 2010/0225353 A1* | 9/2010 | Chang | G06F 1/10 326/93 |
| 2011/0161901 A1* | 6/2011 | Berry | G06F 17/5077 716/108 |

OTHER PUBLICATIONS

Specification and drawings for U.S. Appl. No. 14/467,908, filed Aug. 25, 2014, Dehkordi et al.

* cited by examiner

*Primary Examiner* — Phallaka Kik
(74) *Attorney, Agent, or Firm* — LeRoy D. Maunu

(57) ABSTRACT

Approaches for routing clock signals of a circuit design on an IC include determining initial partitions of clock sources and clock loads. Each initial partition includes one of the clock sources and a subset of the clock loads associated with the one clock source, and initial each partition defines an area of the IC in which the one of the clock sources and the associated subset of clock loads are placed. A processor determines for each of the initial partitions, whether or not the initial partition has a congested clock region. For each initial partition determined to have a congested clock region, the processor defines a respective new partition by excluding the one of the clock sources from the new partition. The new partition includes the subset of the clock loads and does not include the one clock source. The processor then routes clock signals from the clock sources to the clock loads.

18 Claims, 11 Drawing Sheets

PLACEMENT AND ROUTING OF CLOCK SIGNALS FOR A CIRCUIT DESIGN

TECHNICAL FIELD

The disclosure generally relates to placement of clock loads and routing of clock signals for a circuit design.

BACKGROUND

Some programmable integrated circuits (ICs), such as field programmable gate arrays (FPGAs) and system on chip (SOC) products from XILINX®, Inc., have a configurable, mesh-like structure for routing clock signals from clock sources to synchronous circuit elements ("clock loads") of the circuit design. A clock source is a circuit that generates or provides a clock signal, such as a phase-locked loop (PLL), a high-speed serializer-deserializer (SERDES), or an input/output pin. Clock sources and clock loads of a circuit design are placed at locations on the programmable IC as a part of the design implementation process.

At early stages in the design implementation flow, the clock loads are partitioned based on their placement. The clock load partitioning is driven by clocking architectural constraints of the programmable IC and is helpful in the allocation of routing resources during routing of the clock signals. Without suitable partitions of clock loads, a routing solution might be unattainable for the final placement.

SUMMARY

In one implementation, a method of routing clock signals of a circuit design for an integrated circuit (IC) includes performing operations on a programmed processor, including determining initial partitions of clock sources and clock loads. Each initial partition includes one of the clock sources and a subset of the clock loads associated with the one clock source, and each initial partition defines an area of the IC in which the one of the clock sources and the associated subset of clock loads are placed. The processor determines for each of the initial partitions, whether or not the initial partition has a congested clock region. For each initial partition determined to have a congested clock region, the processor defines a respective new partition by excluding the one of the clock sources from the new partition. The new partition includes the subset of the clock loads and does not include the one clock source. The processor then routes clock signals from the clock sources to the clock loads.

In another implementation, a system for routing clock signals of a circuit design for an integrated circuit (IC) includes a computer processor and a memory arrangement coupled to the computer processor. The memory arrangement is configured with instructions that when executed by the computer processor cause the computer processor to determine initial partitions of clock sources and clock loads. Each initial partition includes one of the clock sources and a subset of the clock loads associated with the one clock source, and each initial partition defines an area of the IC in which the one of the clock sources and the associated subset of clock loads are placed. Execution of the instructions further causes the processor to determining for each of the initial partitions, whether or not the initial partition has a congested clock region. For each initial partition determined to have a congested clock region, the instructions cause the processor to define a respective new partition by excluding the one of the clock sources from the new partition. The new partition includes the subset of the clock loads and does not include the one clock source. Execution of the instructions further cause the processor to route clock signals from the clock sources to the clock loads after the defining.

Other features will be recognized from consideration of the Detailed Description and Claims, which follow.

BRIEF DESCRIPTION OF THE DRAWINGS

Various aspects and features of the method and system will become apparent upon review of the following detailed description and upon reference to the drawings in which.

DETAILED DESCRIPTION

Figure 1:
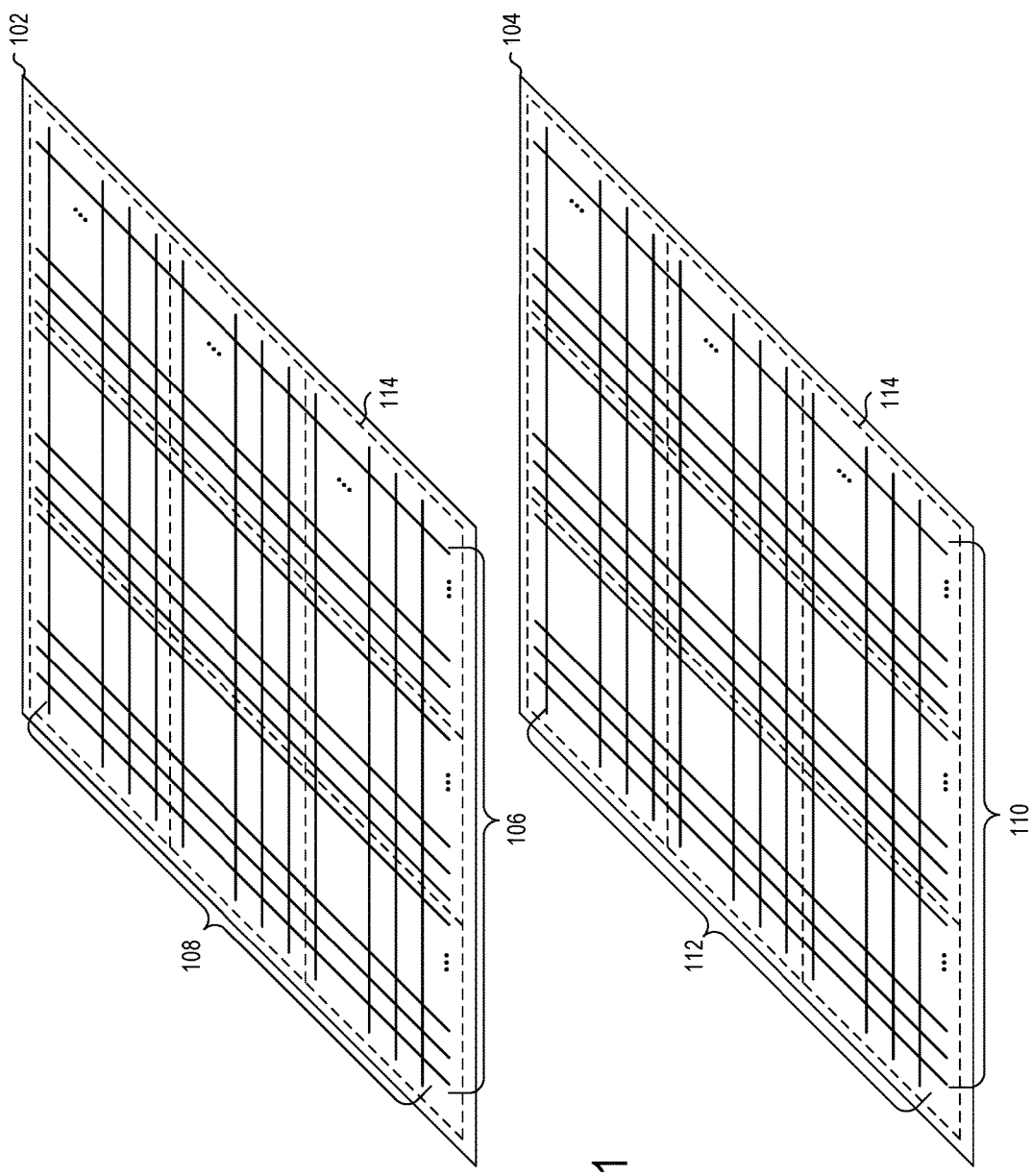
FIG. 1 shows examples of a routing layer and a distribution layer of a clock distribution network of a programmable IC.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

The disclosed methods and systems provide approaches for routing clock signals for a circuit design. The disclosed approaches improve upon prior approaches by constructing and modifying partitions of clock loads and clock sources in a manner that provides flexibility in routing clock signals and avoiding the congestion that might have resulted from prior approaches. According to the disclosed methods and systems, an electronic design automation (EDA) tool executing on a computer processor generates an initial placement of clock sources and clock loads of a circuit design on a programmable integrated circuit (IC). The EDA tool creates partitions of clock sources and clock loads. Each partition includes one of the clock sources, and the clock loads that are to be connected to that clock source. Each partition also defines an area of the programmable IC in which the clock source and the associated clock loads are placed. A congested clock region is a clock region in which there are no unassigned clock routing resources available for routing an additional clock signal. If a partition has a congested clock region, the EDA tool removes the clock source from the partition, which results in the partition having only the clock loads associated with the removed clock source. By removing the clock source, the size of the partition may be reduced and the congested region may no longer be in the partition, thereby allowing routing of the clock signal from the clock source to the clock loads using clock routing resources outside the original partition.

Some programmable ICs, such as ULTRASCALE™ devices from XILINX®, Inc., have a programmable clock distribution network. The clock distribution network includes two independent meshes of routing and distribution grids. FIG. 1 shows examples of a routing layer 102 and a distribution layer 104 of a clock distribution network of a programmable IC. The layers may be part of a programmable IC having programmable logic, input/output (I/O), signal routing, and processor resources (see FIG. 11), for example. The routing layer and distribution layer include respective sets of configurable clock tracks. Each set of clock tracks includes horizontal tracks and vertical tracks. For example, the routing layer includes vertical routing tracks 106 and horizontal routing tracks 108, and the distribution layer includes vertical distribution tracks 110 and horizontal distribution tracks 112. Those skilled in the art will recognize that an actual device would be much larger and have many more clock distribution tracks.

The clock distribution network may be configured to route a clock signal from a clock source to any clock region in the device via horizontal and vertical tracks of the routing layer. The example clock distribution network includes 9 regions, which are outlined with dashed lines in the routing and distribution layers. Region 114 is an example of one of the regions in the routing and distribution layers.

The programmable interconnection point at which a track of the routing layer is connected to a vertical track of the distribution layer may be referred to as the clock root. The region in which the track of the routing layer is connected to the vertical track of the distribution layer may be referred to as the root region. A clock tree can be expanded from the clock root and root region by connecting selected horizontal distribution-layer tracks to the vertical track that has the clock root, and extending the horizontal distribution tracks to all regions where loads of the clock tree are placed. The portion of the distribution-layer vertical track to which the routing-layer track connects may be referred to as a "spine" of the clock tree, and the portions of the horizontal distribution tracks connected to the spine may be referred to as branches.

Figure 2:
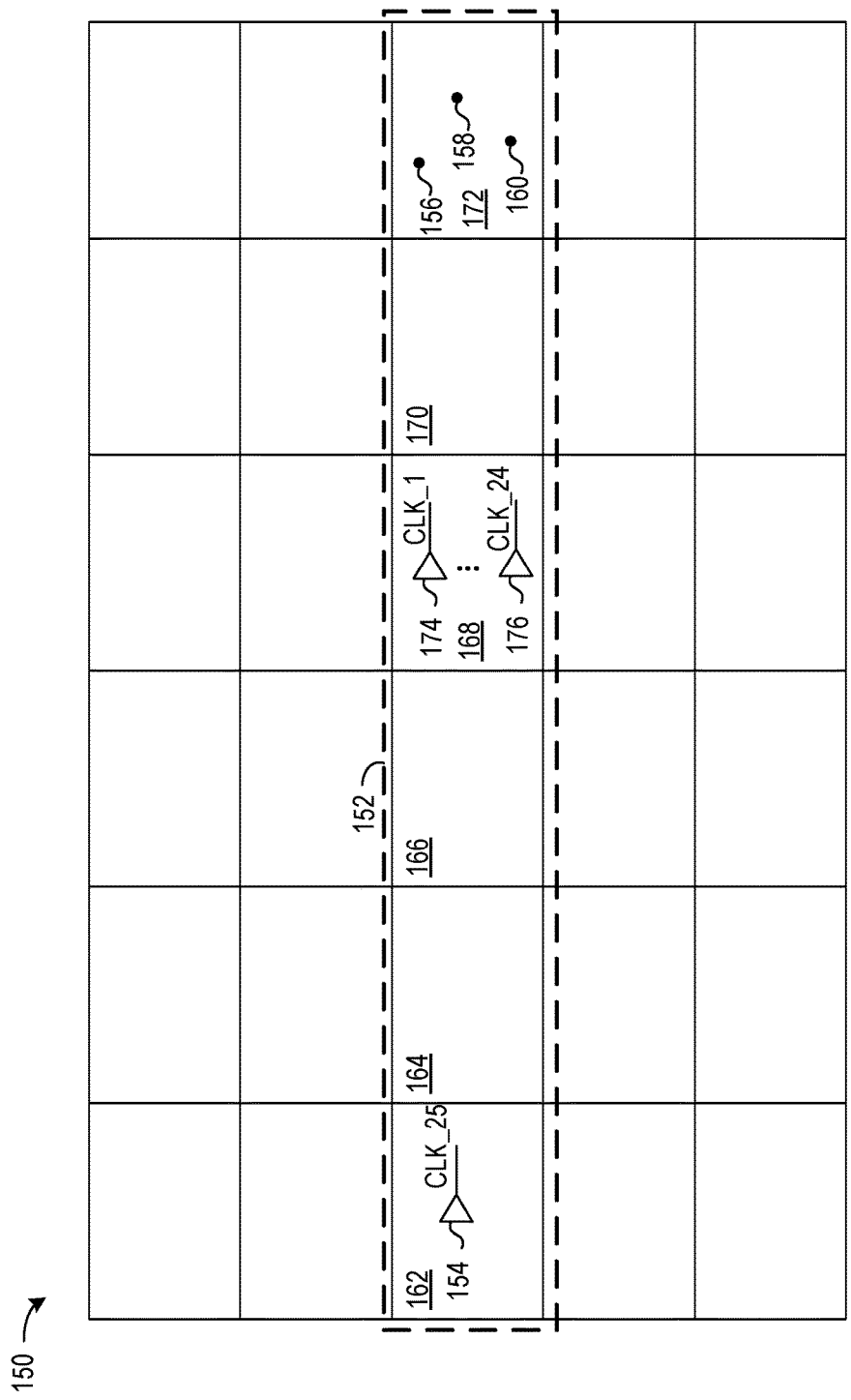
FIG. 2 shows an example of a congested clock region in a partition.

Prior approaches to partitioning limit the potential solution space for routing clock signals, which may result in reduced clock utilization, lower quality of results, and inability to route clock signals. FIG. 2 shows an example of a congested clock region in a partition. The example illustrates a subset 150 of clock regions of a programmable IC, including 5 rows and 6 columns. A partition 152 includes clock source 154 and clock loads 156, 158, and 160, as clock loads 156, 158, and 160 are to receive the clock signal from clock source 154. The partition covers clock regions 162, 164, 166, 168, 170, and 172. The initial partition is defined by a rectangular area formed by the clock regions that include the clock source and the associated clock loads and any additional clock regions needed to complete the rectangular area. The partitions are rectangular in order to allow creation of clock trees that are rooted in any clock region in the partition, and to be able to reach all rows of clock regions in the partition.

Each clock region in the example has 24 routing tracks available for routing 24 clock signals. Clock region 168 is assigned 24 clock signals, which are labeled CLK_1-CLK_24, from 24 clock sources, which are shown as clock sources 174-176. As clock sources have been assigned to the clock region 168, and region 168 is within the partition 152, the clock region 168 is a congested region for purposes of routing the clock signal ("CLK_25") from clock source 154, to the clock loads 156, 158, and 160. That is, routing CLK_25 is limited to the clock routing resources in clock regions 162, 164, 166, 168, 170, and 172, of the partition, but all the clock routing tracks in clock region 168 have been assigned and are unavailable for routing CLK_25.

Prior approaches resolved the problem of the congested clock region 168 by moving clock loads 156, 158, and 160 to another clock region, such as to clock region 166. Such a move, however, disrupts the initial placement and may have a negative effect on the timing of the implemented circuit. According to the disclosed approaches, if the partition has a congested region, the partition is redefined by excluding the clock source from the partition, which may effectively remove the congested clock region from the newly formed partition and permit alternative routing options.

Figure 3:
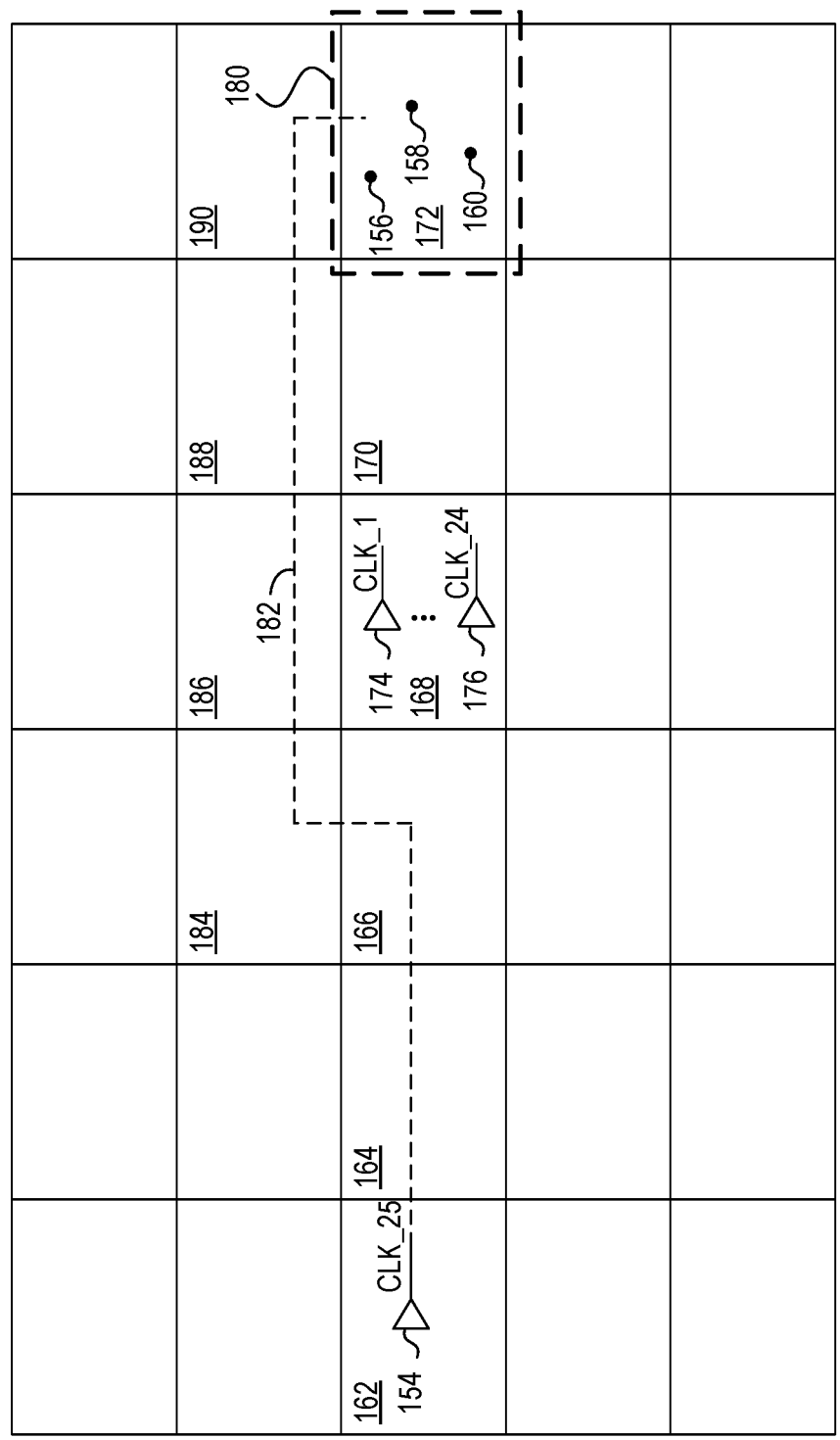
FIG. 3 shows an example of a reduced partition resulting from exclusion of the clock source from the initial partition shown in FIG. 2.

FIG. 3 shows an example of a reduced partition resulting from exclusion of the clock source from the initial partition shown in FIG. 2. By removing the clock source 154 from the partition 152 of FIG. 2, the partition 152 is reduced to partition 180, which covers only clock region 172 having the clock loads 156, 158, and 160 associated with the clock source 154. As routing of clock signal CLK_25 from clock source 154 is no longer limited to the clock regions 162, 164, 166, 168, 170, and 172 within partition 152 as shown in FIG. 2, the potential route 182 may be on clock routing tracks in clock regions 162, 164, 166, 184, 186, 188, 190, and 172, thereby avoiding the congested clock region 168.

Figure 4:
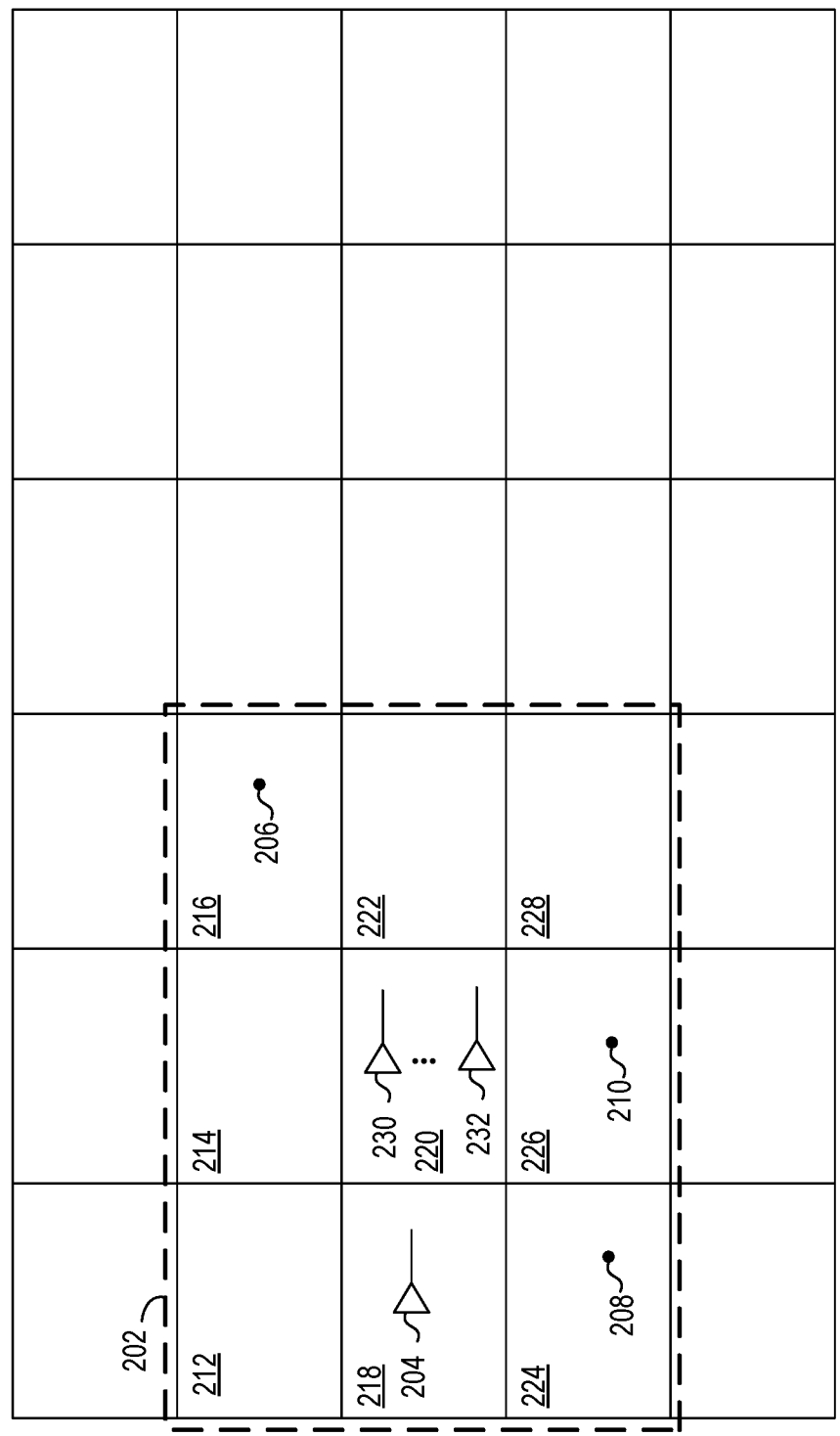
FIG. 4 shows another example of a congested region in a partition.

FIG. 4 shows another example of a congested region in a partition. The partition 202 is initially defined by clock source 204 and clock loads 206, 208, and 210. The clock signal from clock source 204 is to be routed to clock loads 206, 208, and 210, and the partition includes clock regions 212, 214, 216, 218, 220, 222, 224, 226, and 228. Clock sources 230-232 are assigned to clock region 220, and in the example all the clock routing tracks in clock region 220 are assigned to clock sources 230-232. For example, there are 24 clock sources 230-232 and 24 clock routing tracks in the clock region. Clock region 220 is congested as all the clock routing tracks have been assigned to clock signals.

Figure 5:
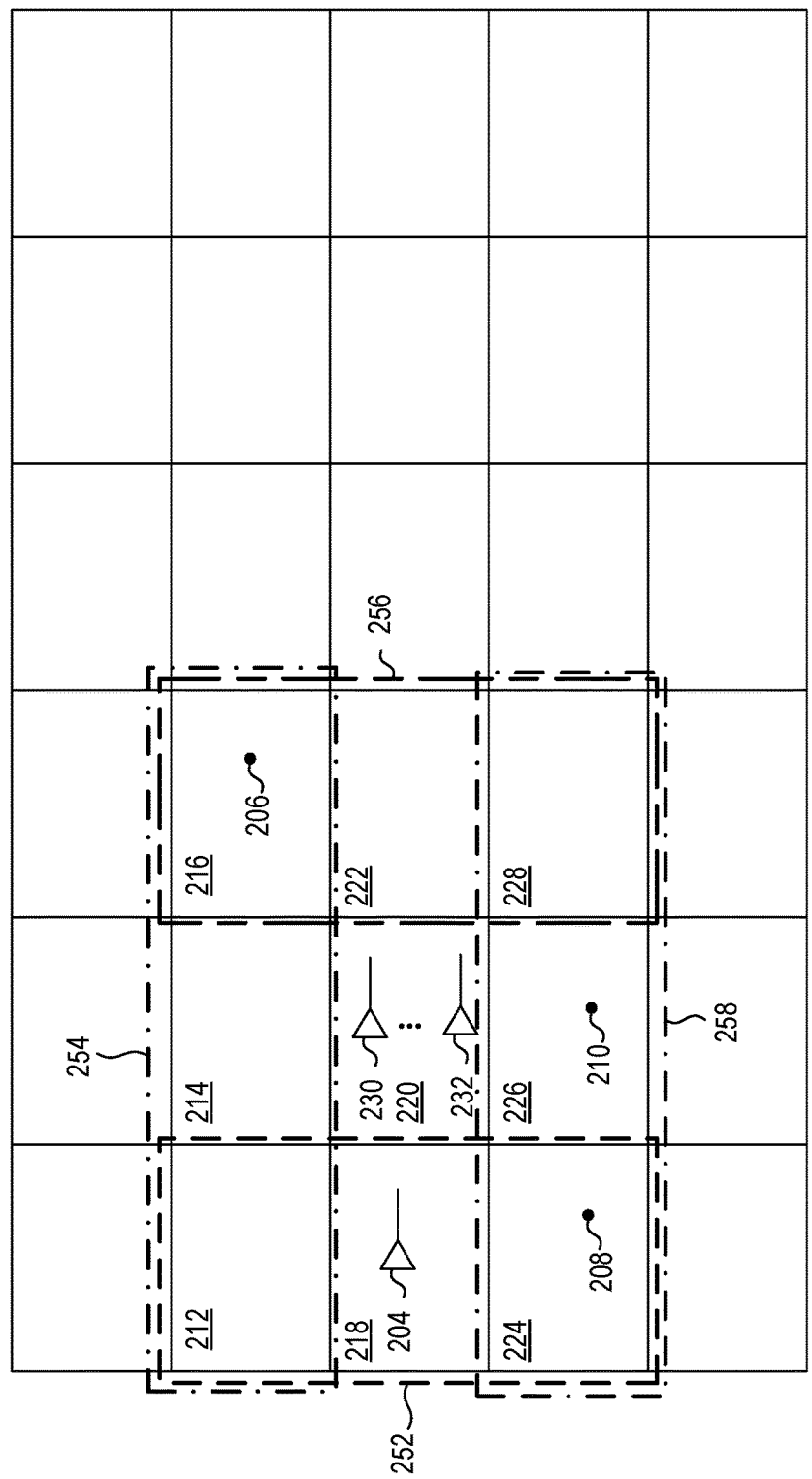
FIG. 5 continues the example of FIG. 4 and shows options for partitions that avoid the congested clock region.

FIG. 5 continues the example of FIG. 4 and shows options for partitions that avoid the congested clock region. In the example of FIGS. 4 and 5, some of the clock loads may need to be moved in order to avoid the congested region 220.

Partitions 252, 254, 256, and 258 are alternative partitions that avoid the congested partition 220. Prior approaches that required the clock source and clock loads to be in the same partition would be limited to partition 252, which covers clock regions 212, 218, and 224, and both of clock loads 206 and 210 would need to be moved to one of the clock regions in the partition 252. In the current approach, the clock source may be excluded from the partition that covers the clock loads, and in the example any of the 4 alternative partitions 252, 254, 256, and 258 may be considered in moving the clock loads. The chosen partition may be the partition which minimizes movement of the clock loads.

Figure 6:
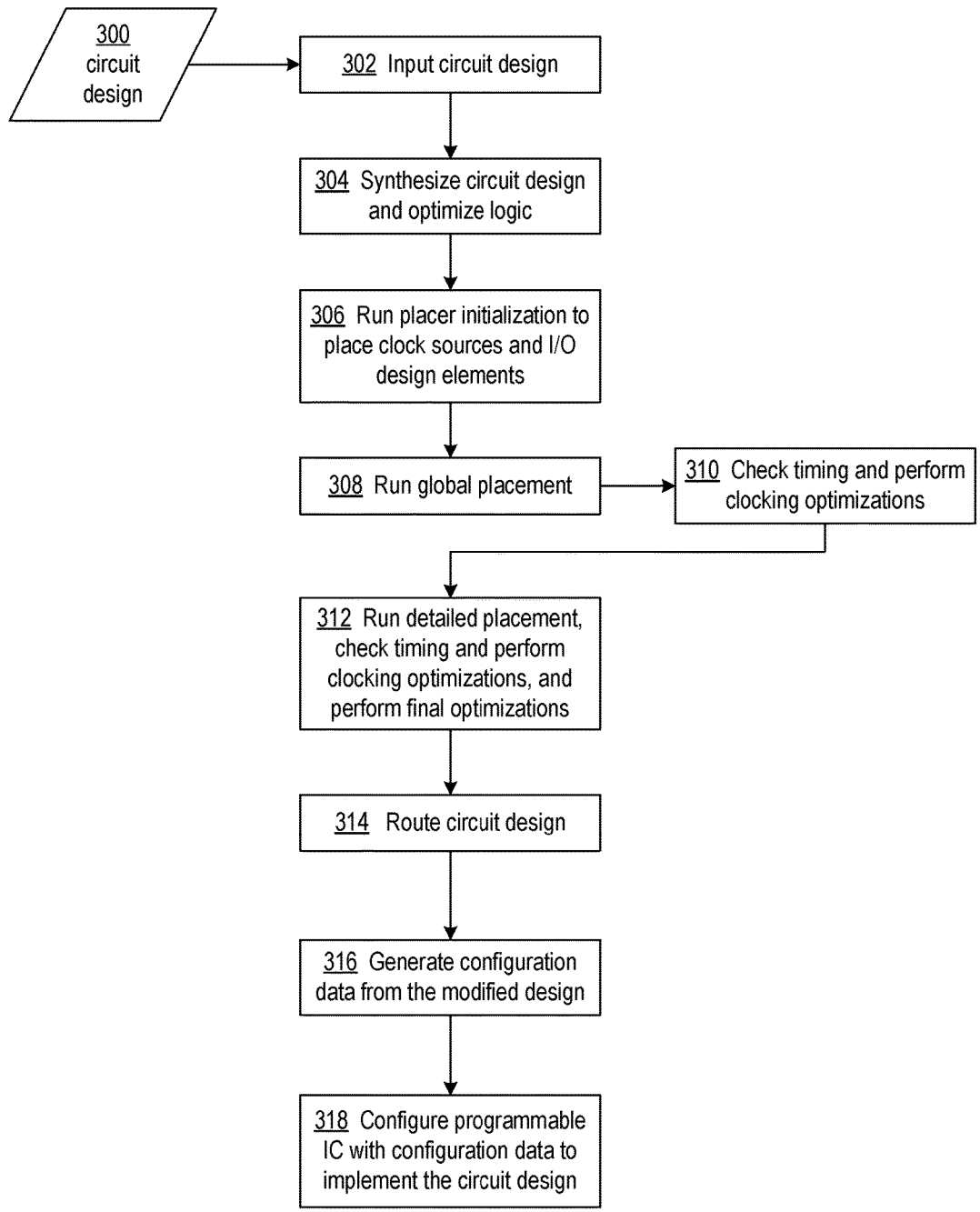
FIG. 6 shows a flowchart of a process for generating a circuit from a circuit design and avoiding congested clock regions by excluding clock sources from partitions having congested regions.

FIG. 6 shows a flowchart of a process for generating a circuit from a circuit design and avoiding congested clock regions by excluding clock sources from partitions having congested regions. An electronic design automation (EDA) tool executing on a processor inputs circuit design 300 at block 302. The EDA tool synthesizes the circuit design and optimizes logic at block 304. Once the design has been synthesized, at block 306 the EDA tool runs placer initialization that establishes locations on the target device for clock sources and I/O circuit elements of the circuit design and assigns clock signals to clock routing resources in the clock regions. Placement of clock sources results in assignment of clock sources and signals to a clock routing track in a region.

Figure 7:
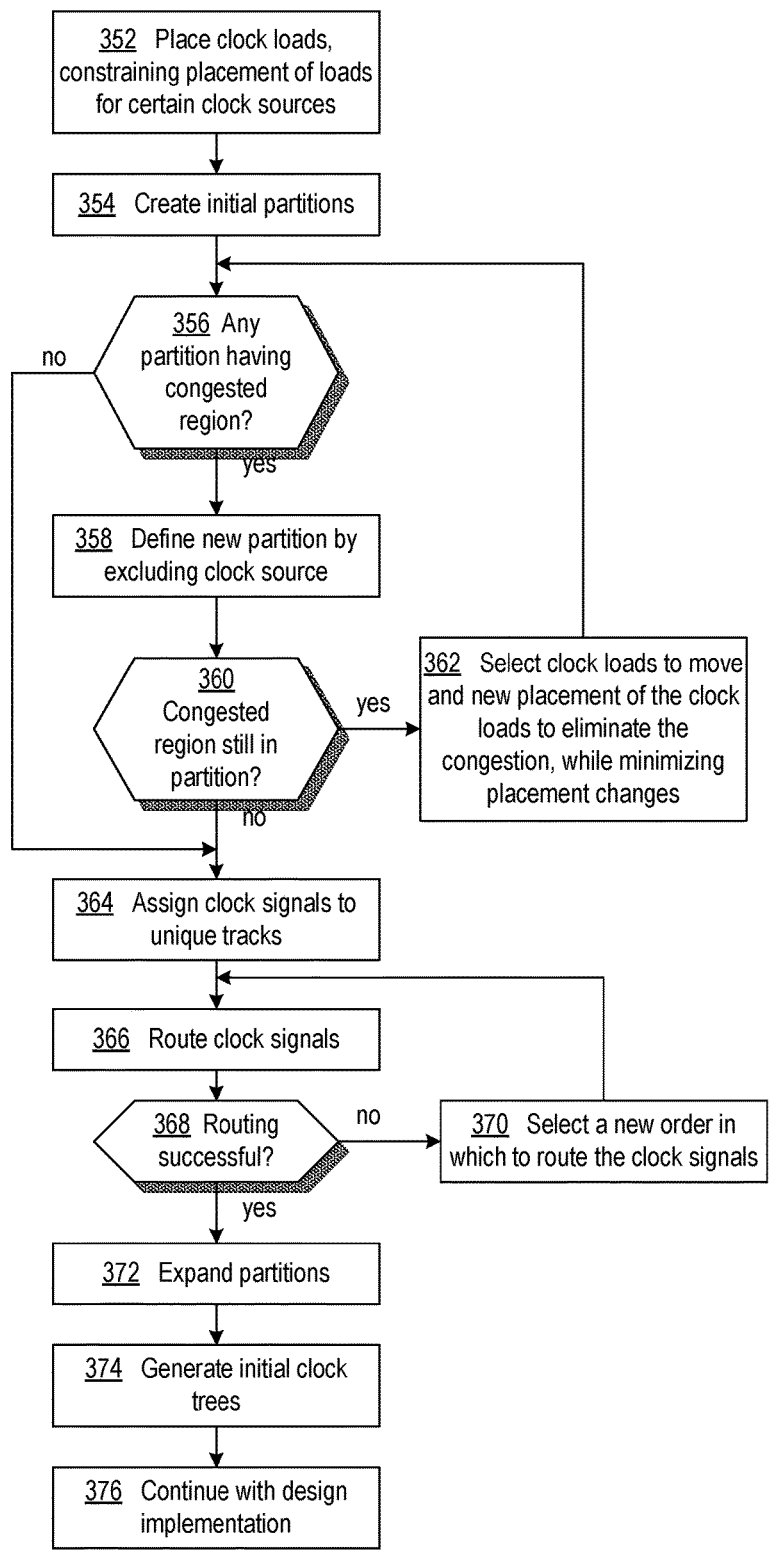
FIG. 7 shows a flowchart of a process for partitioning clock sources and clock loads.

At block 308, the EDA tool runs a global placement process. The global placement process attempts to determine a well spread, ideally with no overlaps, placement of the cells for a given netlist, such that the placement attains the required objectives such as wirelength minimization or timing specifications. Some global placement algorithms include analytic techniques which approximate the wirelength objective using quadratic or nonlinear formulations, partitioning-based placement algorithms and stochastic techniques. The clock source and load partitioning approaches, which are described further in FIG. 7, are part of the global placement process.

The EDA tool at block 310 runs a static timing analysis process on the globally placed circuit design and performs various clocking optimizations if timing constraints are not satisfied. The clock optimizations of block 310 include converting a clock tree having a single clock root to a clock tree having multiple clock roots, converting the centered clock root(s) of a balanced clock to a clock tree in which the clock root(s) are not centered, changing programmable delay values associated with branches of a balanced clock tree, and moving the clock roots of balanced clock trees nearer to one another to remedy cross domain clock skew between multiple balanced clock trees.

At block 312, the EDA tool runs a detailed placement process and repeats the operations of running a static timing analysis on the detailed placed circuit design and performs various clocking optimizations if timing constraints are not satisfied. The detailed placement process attempts to legalize the result from global placement with as little cell movement as possible. In addition, detailed placement has more concrete objectives on meeting the timing specifications and minimizing wirelength. The EDA tool also performs a final optimization, timing check, and clocking optimization at block 312. The final optimization process attempts to meet the timing specification of the design by iteratively improving the placement of the worst timing critical path.

If the placed circuit design after the final optimization of block and clocking optimizations of block 312 satisfies timing constraints, the EDA tool routes the circuit design at block 314. At block 316, the EDA tool generates configuration data from the placed-and-routed circuit design. For example, bitstream generation tools may be executed on a processor to generate configuration data for a programmable IC having a field programmable gate array (FPGA). At block 318, a programmable IC may be configured with the configuration data, thereby creating clock trees in a circuit that operates according to the circuit design.

FIG. 7 shows a flowchart of a process for partitioning clock sources and clock loads. At block 352, the EDA tool places clock loads, and constrains placement of clock loads for certain ones of the clock sources. Though clock signals may be distributed throughout the entire programmable IC by the routing resources illustrated in FIG. 1, there are many cases in which clock signals remain local or regional. For example in one case, the clock buffers used in high-speed transceivers are clock sources that provide clock signals to clock loads next to the transceivers. Absent placement guidance, the clock loads might be placed at locations that increase the likelihood of clock legalization or routing issues.

Figure 8:
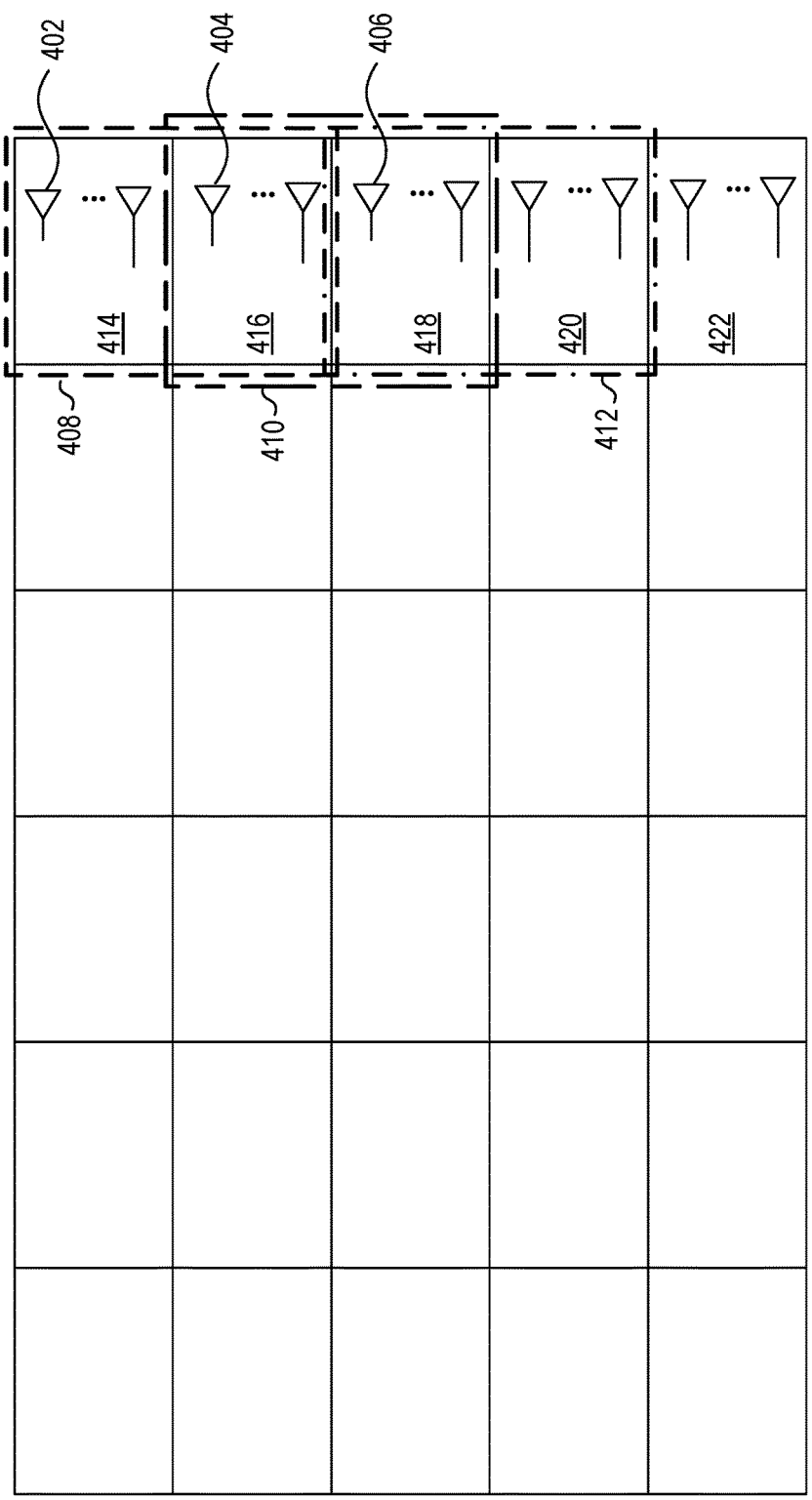
FIG. 8 shows an example in which clock loads are placed relatively close to their associated clock sources.
Figure 9:
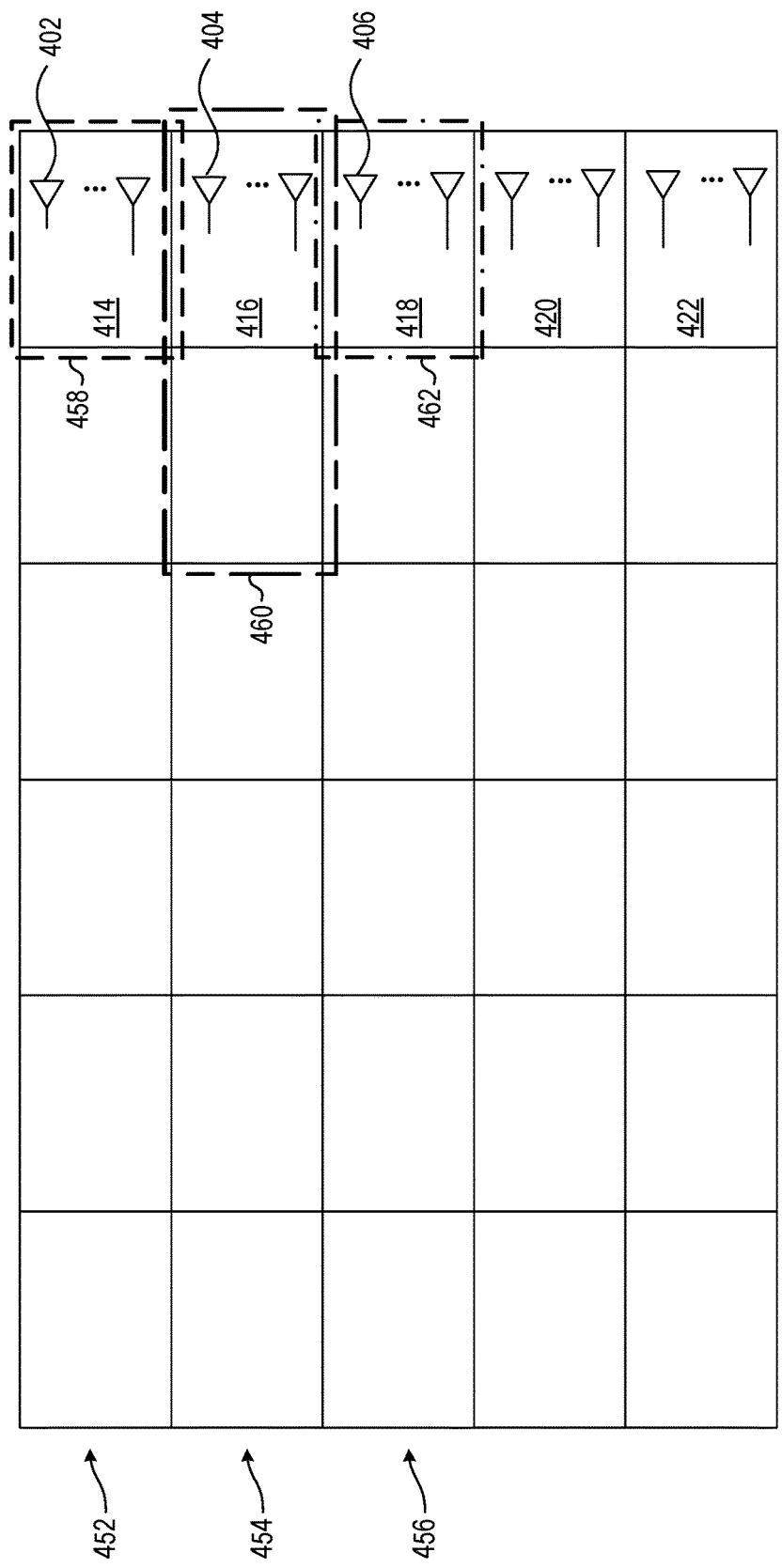
FIG. 9 shows an example in which the placement of clock loads of selected clock sources is constrained to the rows of clock regions of the clock sources.

In an example implementation, for selected clock sources the EDA tool constrains placement of clock loads that are associated with the clock sources to the clock regions in the rows of the clock sources, respectively. For example, the selected clock sources may be the aforementioned clock buffers in the high-speed transceivers. Placement of the clock loads associated with a clock source is constrained to the same row of clock regions in which the clock source is located. Limiting each clock load to the row of clock regions having the clock source relieves congestion that may occur due to clock signals crossing rows of clock regions. FIGS. 8 and 9 show an example involving constraining placement of clock loads for certain clock sources.

With the processing of block 306 of FIG. 6 and block 352 of FIG. 7, the EDA tool generates an initial placement of the clock sources and clock loads. The clock signals of the clock sources and clock loads are assigned to clock routing resources within each clock region. At block 354, the EDA tool creates initial partitions. Each initial partition includes a clock source and the associated clock loads that are to receive the clock signal from the clock source. Each partition defines an area of the programmable IC in which the clock source and the associated of clock loads are placed.

At block 356, the EDA tool determines whether or not any of the initial partitions have congested regions. If all the clock routing resources in a region are assigned to clock signals, then the clock region is considered to be congested. If a clock region in an initial partition is found to be congested, at block 358 the EDA tool defines a new partition by excluding the clock source from the new partition. The new partition includes the clock loads associated with the clock source but does not include the clock source.

Excluding the clock source from the new partition may or may not eliminate the congested clock region from the partition. If the congested clock region is in the new partition, at decision block 360 the EDA tool continues the process at block 362. At block 362, the EDA tool avoids the congested clock region by selecting clock loads to move between clock regions and determining a new placement for the selected clock loads. The selection of the clock loads to be moved and the determination of the new placement attempts to minimize the changes in placement. For example, the EDA tool determines alternative moves for the clock loads. Each alternative move identifies one or more of the clock loads in the partition and corresponding new locations for the clock loads such that routing the clock signal from the clock source to the clock loads can avoid the congested clock region. The EDA tool determines a respective cost of each alternative move based on the number of clock loads identified in each move, and the total distance between the original and new locations of the clock loads. The move having the least cost is selected by the EDA tool and the clock loads moved accordingly. The process then returns to decision block 356 to determine whether or not there are any more partitions having congested clock regions.

At block 364, the EDA tool assigns clock signals to clock routing tracks in the clock regions in which the clock sources and clock loads are placed. Once the congested regions have been removed from the partitions, no congestion should interfere with routing the clock signals. The clock signals are routed from the clock sources to the clock loads by the EDA tool at block 366. For an initial partition not having a congested region, the EDA tool constrains routing of the clock signal to clock routing resources of clock regions within the initial partition. For a new partition, the EDA tool routes the clock signal from the clock source to the clock loads unconstrained by clock regions within the initial partition; that is clock routing resources outside the initial partition may be used to route the clock signal from the clock source to the clock loads.

The EDA tool determines at decision block 368 whether or not the clock signals were successfully routed. If the routing of clock signals is not successful, the EDA tool selects a new order in which clock signals will be routed in another iteration at block 370. The nets are initially ordered based on fanout (with nets with greater fanout having higher priority). For nets with equal fanouts, the EDA tool uses load timing criticality as tie-breaker, with nets with higher criticality having higher priority. The new ordering is a random perturbation of the initial order. After selecting the new order, the EDA tool attempts to route the clock signals in the new order at block 366.

Once routing is successful from decision block 368, at block 372, the EDA tool expands partitions for which expansion is feasible. A partition may be expanded if the added clock regions do not create congestion within the expanded partition. Expanded partitions may be useful in later stages of detailed and final placement for modifying clock routes using clock routing resources in the clock regions of the expanded partition, such as at block 312 of FIG. 6. At block 374, the EDA tool generates initial clock trees, and at block 376, the EDA tool continues with the design implementation flow at block 310 of FIG. 6.

FIG. 8 shows an example in which clock loads are placed relatively close to their associated clock sources. As described above, for some types of clock sources, the clock loads are likely to remain local or regional, such as in the case of the clock buffers used in high-speed serial transceivers (not shown). Clock sources 402, 404, and 406 are examples of a type of clock source for which the associated clock loads are nearby. In the example, the clock loads (not shown) of clock source 402 are in partition 408, the clock loads (not shown) of clock source 404 are in partition 410, and the clock loads (not shown) of clock source 406 are in partition 412. In some programmable ICs, the high-speed serial transceivers are located along the outer edge of the clock regions 414, 416, 418, 420, and 422.

Congestion may result if a large number of clock sources in adjacent regions feed clock loads in nearby regions. In the example, the clock source 402 feeds clock loads in clock regions 414 and 416, and clock source 404 also feeds clock loads in clock region 416. Thus, clock routing resources in clock region 416 used to route from clock source 402 to clock loads in clock region 416 would be unavailable for routing from clock source 404 to clock loads in clock region 416. Similarly, clock routing resources in clock region 416 used to route from clock source 404 to clock loads in clock region 416 would be unavailable for routing from clock source 402 to clock loads in clock region 416. If a large number of clock sources are placed in the regions 414, 416, 418, and 420, congestion and routing conflicts are likely.

The EDA tool constrains placement of clock loads for certain types of clock sources in order to reduce the likelihood of congestion. In the example, EDA tool constrains placement of clock loads of clock sources that are clock buffers of high-speed serial transceivers to the row of clock regions of the clock sources, as shown in FIG. 9.

FIG. 9 shows an example in which the placement of clock loads of selected clock sources is constrained to the rows of clock regions of the clock sources. FIG. 9 continues the example begun in FIG. 8. The clock loads (not shown) of clock source 402 are constrained to the row 452 of clock regions that includes clock region 414, the clock loads (not shown) of clock source 404 are constrained to the row 454 of clock regions that includes clock region 416, and the clock loads (not shown) of clock source 406 are constrained to the row 456 of clock regions that includes clock region 418.

Once the clock loads are placed according to the constraints, the initial partition for clock source 402 and the associated clock loads is partition 458, the initial partition for clock source 404 and the associated clock loads is partition 460, and the initial partition for clock source 406 and the associated clock loads is partition 462. Limiting the placement of the clock loads to the row of clock regions in which the associated clock source is placed eliminates the congestion that may result from clock signals having to cross rows of clock regions.

Figure 10:
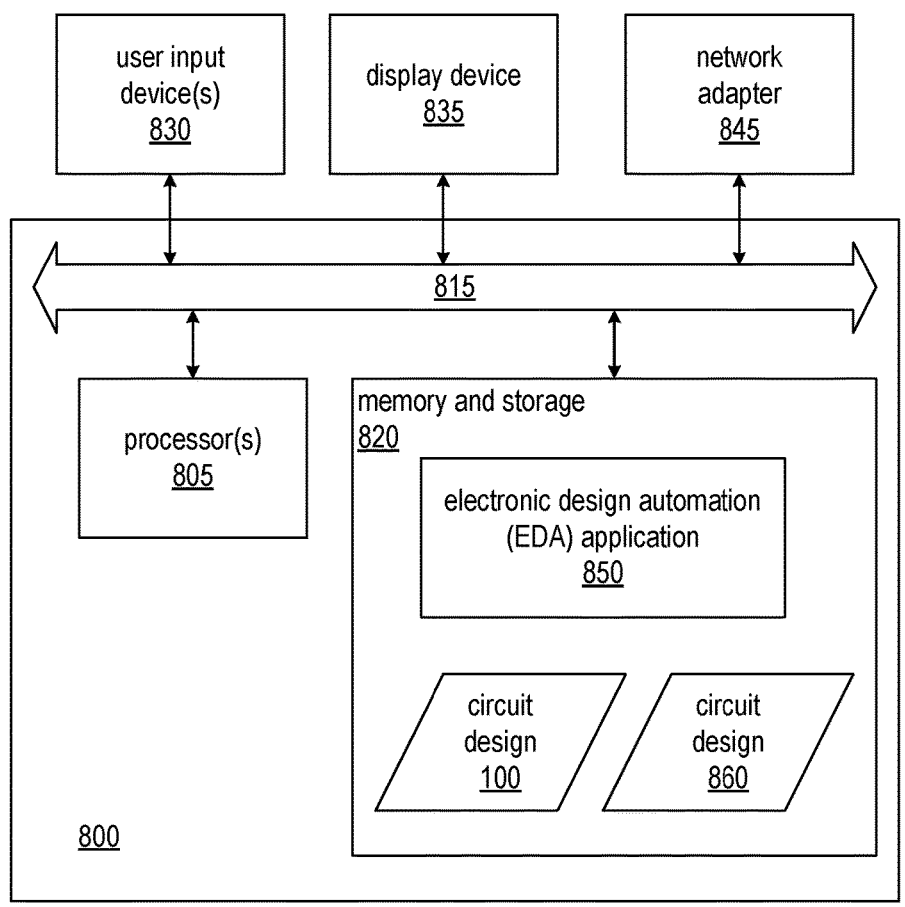
FIG. 10 is a block diagram illustrating an exemplary data processing system.

FIG. 10 is a block diagram illustrating an exemplary data processing system (system) 800. System 800 is an example of an EDA system. As pictured, system 800 includes at least one processor circuit (or "processor"), e.g., a central processing unit (CPU) 805 coupled to memory and storage arrangement 820 through a system bus 815 or other suitable circuitry. System 800 stores program code and circuit design 100 within memory and storage arrangement 820. Processor 805 executes the program code accessed from the memory and storage arrangement 820 via system bus 815. In one aspect, system 800 is implemented as a computer or other data processing system that is suitable for storing and/or executing program code. It should be appreciated, however, that system 800 can be implemented in the form of any system including a processor and memory that is capable of performing the functions described within this disclosure.

Memory and storage arrangement 820 includes one or more physical memory devices such as, for example, a local memory (not shown) and a persistent storage device (not shown). Local memory refers to random access memory or other non-persistent memory device(s) generally used during actual execution of the program code. Persistent storage can be implemented as a hard disk drive (HDD), a solid state drive (SSD), or other persistent data storage device. System 800 may also include one or more cache memories (not shown) that provide temporary storage of at least some program code and data in order to reduce the number of times program code and data must be retrieved from local memory and persistent storage during execution.

Input/output (I/O) devices such as user input device(s) 830 and a display device 835 may be optionally coupled to system 800. The I/O devices may be coupled to system 800 either directly or through intervening I/O controllers. A network adapter 845 also can be coupled to system 800 in order to couple system 800 to other systems, computer systems, remote printers, and/or remote storage devices through intervening private or public networks. Modems, cable modems, Ethernet cards, and wireless transceivers are examples of different types of network adapter 845 that can be used with system 800.

Memory and storage arrangement 820 may store an EDA application 850. EDA application 850, being implemented in the form of executable program code, is executed by processor(s) 805. As such, EDA application 850 is considered part of system 800. System 800, while executing EDA application 850, receives and operates on circuit design 100. In one aspect, system 800 performs a design flow on circuit design 100, and the design flow may include synthesis, mapping, placement, routing, and the application of one or more physical optimization techniques as described herein. System 800 generates an optimized, or modified, version of circuit design 100 as circuit design 860.

EDA application 850, circuit design 100, circuit design 860, and any data items used, generated, and/or operated upon by EDA application 850 are functional data structures that impart functionality when employed as part of system 800 or when such elements, including derivations and/or modifications thereof, are loaded into an IC such as a programmable IC causing implementation and/or configuration of a circuit design within the programmable IC.

Figure 11:
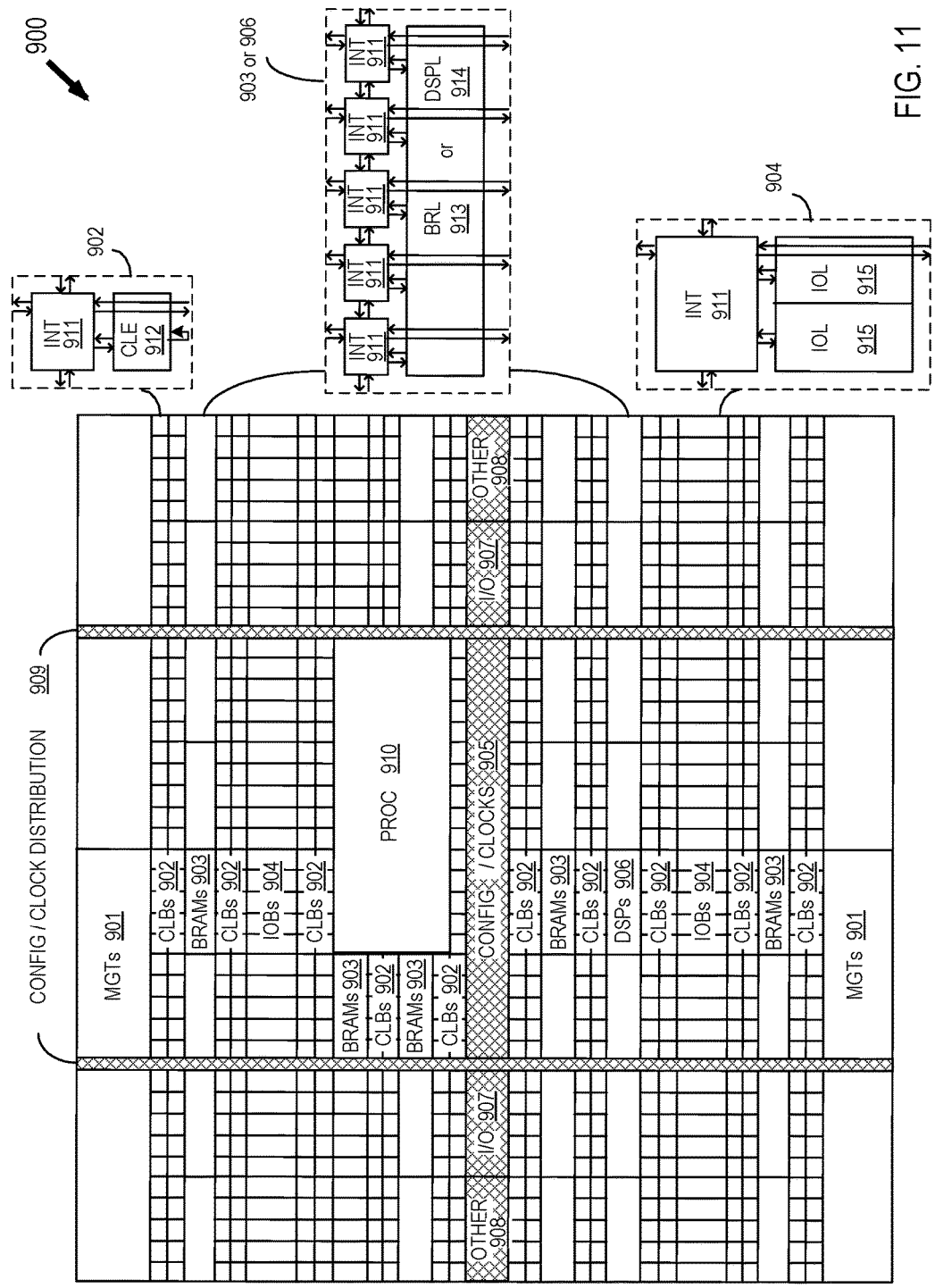
FIG. 11 shows a programmable integrated circuit (IC) on which the disclosed circuits and processes may be implemented.

FIG. 11 shows a programmable integrated circuit (IC) 900 on which the disclosed clock distribution networks may be implemented. The programmable IC may also be referred to as a System On Chip (SOC) that includes field programmable gate array logic (FPGA) along with other programmable resources. FPGA logic may include several different types of programmable logic blocks in the array. For example, FIG. 11 illustrates programmable IC 900 that includes a large number of different programmable tiles including multi-gigabit transceivers (MGTs) 901, configurable logic blocks (CLBs) 902, random access memory blocks (BRAMs) 903, input/output blocks (IOBs) 904, configuration and clocking logic (CONFIG/CLOCKS) 905, digital signal processing blocks (DSPs) 906, specialized input/output blocks (I/O) 907, for example, clock ports, and other programmable logic 908 such as digital clock managers, analog-to-digital converters, system monitoring logic, and so forth. Some programmable IC having FPGA logic also include dedicated processor blocks (PROC) 910 and internal and external reconfiguration ports (not shown).

In some FPGA logic, each programmable tile includes a programmable interconnect element (INT) 911 having standardized connections to and from a corresponding interconnect element in each adjacent tile. Therefore, the programmable interconnect elements taken together implement the programmable interconnect structure for the illustrated FPGA logic. The programmable interconnect element INT 911 also includes the connections to and from the programmable logic element within the same tile, as shown by the examples included at the top of FIG. 11.

For example, a CLB 902 can include a configurable logic element CLE 912 that can be programmed to implement user logic, plus a single programmable interconnect element INT 911. A BRAM 903 can include a BRAM logic element (BRL) 913 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 906 can include a DSP logic element (DSPL) 914 in addition to an appropriate number of programmable interconnect elements. An 10B 904 can include, for example, two instances of an input/output logic element (IOL) 915 in addition to one instance of the programmable interconnect element INT 911. As will be clear to those of skill in the art, the actual I/O bond pads connected, for example, to the I/O logic element 915, are manufactured using metal layered above the various illustrated logic blocks, and typically are not confined to the area of the input/output logic element 915.

In the pictured embodiment, a columnar area near the center of the die (shown shaded in FIG. 11) is used for configuration, clock, and other control logic. Horizontal areas 909 extending from this column are used to distribute the clocks and configuration signals across the breadth of the programmable IC. Note that the references to "columnar" and "horizontal" areas are relative to viewing the drawing in a portrait orientation.

Some programmable ICs utilizing the architecture illustrated in FIG. 11 include additional logic blocks that disrupt the regular columnar structure making up a large part of the programmable IC. The additional logic blocks can be programmable blocks and/or dedicated logic. For example, the processor block PROC 910 shown in FIG. 11 spans several columns of CLBs and BRAMs.

Note that FIG. 11 is intended to illustrate only an exemplary programmable IC architecture. The numbers of logic blocks in a column, the relative widths of the columns, the number and order of columns, the types of logic blocks included in the columns, the relative sizes of the logic blocks, and the interconnect/logic implementations included at the top of FIG. 11 are purely exemplary. For example, in an actual programmable IC, more than one adjacent column of CLBs is typically included wherever the CLBs appear, to facilitate the efficient implementation of user logic.

Though aspects and features may in some cases be described in individual figures, it will be appreciated that features from one figure can be combined with features of another figure even though the combination is not explicitly shown or explicitly described as a combination. Terms such as "vertical" and "horizontal" may be used herein to refer to relative positions of elements as shown in the figures. It should be understood that the terminology is used for notational convenience only and that in actual use the disclosed structures may be oriented different from the orientation shown in the figures. Thus, the terms should not be construed in a limiting manner.

The disclosed methods and system are thought to be applicable to a variety of systems for addressing clock skew. Other aspects and features will be apparent to those skilled in the art from consideration of the specification. It is intended that the specification and drawings be considered as examples only, with a true scope of the invention being indicated by the following claims.

What is claimed is:

1. A method of routing clock signals of a circuit design for a programmable integrated circuit (IC), comprising:
   on a programmed processor, performing operations including:
      determining initial partitions of clock sources and clock loads, wherein:
         each initial partition includes one of the clock sources and a subset of the clock loads associated with the one clock source,
         the one clock source and the associated subset of clock loads are assigned to one or more clock regions of one of the initial partitions, and
         each initial partition defines an area of the IC in which the one of the clock sources and the associated subset of clock loads are placed;
      determining for each of the initial partitions, whether or not the initial partition has a congested clock region;
      defining, for each initial partition determined to have a congested clock region, a respective new partition that excludes the one clock source and includes the subset of the clock loads;

maintaining, for each respective new partition, assignments of the one clock source and the associated subset of clock loads to the one or more clock regions of the one of the initial partitions;
routing clock signals from the clock sources to the clock loads after the defining;
routing the circuit design;
generating configuration data after routing the circuit design; and
configuring the programmable IC with the configuration data to implement the circuit design on the programmable IC.

2. The method of claim 1, further comprising:
determining whether or not a new partition includes a congested clock region; and
in response to determining that a new partition includes a congested clock region, moving one or more clock loads of the subset of the clock loads from the congested clock region of the new partition to another clock region.

3. The method of claim 2, wherein the moving includes:
determining alternative moves, wherein each alternative move identifies one or more clock loads and one or more new locations for the one or more clock loads, respectively;
determining costs of the alternative moves, respectively, each cost being a function of a number of the one or more clock loads of the move, and a total distance between the one or more new locations and one or more previous locations of the one or more clock loads; and
selecting one of the alternative moves having a least cost.

4. The method of claim 1, wherein the routing includes:
routing clock signals from the clock sources to the clock loads in a first order of clock signals;
determining whether or not the routing of the clock signals in the first order is successful; and
routing, in response to the routing of the clock signals in the first order being unsuccessful, clock signals from the clock sources to the clock loads in a second order of clock signals that is different from the first order.

5. The method of claim 1, wherein:
the IC is a programmable IC that includes routing tracks and distribution tracks;
the programmable IC includes a plurality of clock regions arranged in rows, each clock region includes a respective subset of synchronous circuit elements, and the clock loads are placed on the respective subsets of synchronous circuit elements; and
the routing tracks are configurable to carry clock signals to selected ones of the clock regions, within each clock region the routing tracks are configurable to connect to a signal line of the distribution tracks in the clock region, and within each clock region the distribution tracks are configurable to carry clock signals to the respective subset of synchronous circuit elements in the clock region; and
the method further comprising, for each clock source in a subset of the clock sources and placed in a clock region in one of the rows, constraining placement of clock loads associated with the clock source to clock regions in the one of the rows.

6. The method of claim 1, wherein:
the IC is a programmable IC that includes routing tracks and distribution tracks;
the programmable IC includes a plurality of clock regions, each clock region includes a respective subset of synchronous circuit elements, and the clock loads are placed on the respective subsets of synchronous circuit elements; and
the routing tracks are configurable to carry clock signals to selected ones of the clock regions, within each clock region the routing tracks are configurable to connect to a signal line of the distribution tracks in the clock region, and within each clock region the distribution tracks are configurable to carry clock signals to the respective subset of synchronous circuit elements in the clock region; and
the method further comprising:
expanding the respective new partition into an expanded partition; and
modifying routes of the clock signals using the expanded partition.

7. The method of claim 1, further comprising:
assigning clock signals to clock routing resources in clock regions of the IC; and
wherein the determining for each of the initial partitions, whether or not the partition has a congested clock region includes determining whether or not all clock routing resources in a region are assigned to clock signals.

8. The method of claim 1, wherein the routing includes:
constraining routing of a clock signal, for each initial partition not having a congested region, to clock routing resources of clock regions within the partition; and
routing a clock signal, for the respective new partition, from the one of the clock sources to the associated subset of clock loads unconstrained by clock regions within the initial partition.

9. The method of claim 8, further comprising:
assigning clock signals to clock routing resources in clock regions of the IC; and
wherein the determining for each of the initial partitions, whether or not the partition has a congested clock region includes determining whether or not all clock routing resources in a region are assigned to clock signals.

10. A system for routing clock signals of a circuit design for a programmable integrated circuit (IC), comprising:
a computer processor;
a memory arrangement coupled to the computer processor, wherein the memory arrangement is configured with instructions that when executed by the computer processor cause the computer processor to perform operations including:
determining initial partitions of clock sources and clock loads, wherein:
each initial partition includes one of the clock sources and a subset of the clock loads associated with the one clock source,
the one clock source and the associated subset of clock loads are assigned to one or more clock regions of one of the initial partitions, and
each initial partition defines an area of the IC in which the one of the clock sources and the associated subset of clock loads are placed;
determining for each of the initial partitions, whether or not the initial partition has a congested clock region;
defining, for each initial partition determined to have a congested clock region, a respective new partition that excludes the one clock source and includes the subset of the clock loads;
maintaining, for each respective new partition, assignments of the one clock source and the associated subset of clock loads to the one or more clock regions of the one of the initial partitions;
routing clock signals from the clock sources to the clock loads after the defining;
routing the circuit design;
generating configuration data after routing the circuit design; and
configuring the programmable IC with the configuration data to implement the circuit design on the programmable IC.

11. The system of claim 10, the operations further comprising:
determining whether or not a new partition includes a congested clock region; and
in response to determining that a new partition a congested clock region, moving one or more clock loads of the subset of the clock loads from the congested clock region of the new partition to another clock region.

12. The system of claim 11, wherein the instructions for moving include instructions that when executed by the computer processor cause the computer processor to:
determine alternative moves, wherein each alternative move identifies one or more clock loads and one or more new locations for the one or more clock loads, respectively;
determine costs of the alternative moves, respectively, each cost being a function of a number of the one or more clock loads of the move, and a total distance between the one or more new locations and one or more previous locations of the one or more clock loads; and
select one of the alternative moves having a least cost.

13. The system of claim 10, wherein the instructions for routing instructions that when executed by the computer processor cause the computer processor to:
route clock signals from the clock sources to the clock loads in a first order of clock signals;
determine whether or not the routing of the clock signals in the first order is successful; and
route, in response to the routing of the clock signals in the first order being unsuccessful, clock signals from the clock sources to the clock loads in a second order of clock signals that is different from the first order.

14. The system of claim 10, wherein:
the IC is a programmable IC that includes routing tracks and distribution tracks;
the programmable IC includes a plurality of clock regions arranged in rows, each clock region includes a respective subset of synchronous circuit elements, and the clock loads are placed on the respective subsets of synchronous circuit elements; and
the routing tracks are configurable to carry clock signals to selected ones of the clock regions, within each clock region the routing tracks are configurable to connect to a signal line of the distribution tracks in the clock region, and within each clock region the distribution tracks are configurable to carry clock signals to the respective subset of synchronous circuit elements in the clock region; and
the operations further including, for each clock source in a subset of the clock sources and placed in a clock region in one of the rows, constraining placement of clock loads associated with the clock source to clock regions in the one of the rows.

15. The system of claim 10, wherein:
the IC is a programmable IC that includes routing tracks and distribution tracks;
the programmable IC includes a plurality of clock regions, each clock region includes a respective subset of synchronous circuit elements, and the clock loads are placed on the respective subsets of synchronous circuit elements; and
the routing tracks are configurable to carry clock signals to selected ones of the clock regions, within each clock region the routing tracks are configurable to connect to a signal line of the distribution tracks in the clock region, and within each clock region the distribution tracks are configurable to carry clock signals to the respective subset of synchronous circuit elements in the clock region; and
the operations further including:
expanding the respective new partition into an expanded partition; and
modifying routes of the clock signals using the expanded partition.

16. The system of claim 10, the operations further including:
assigning clock signals to clock routing resources in clock regions of the IC; and
wherein the determining for each of the initial partitions, whether or not the partition has a congested clock region includes determining whether or not all clock routing resources in a region are assigned to clock signals.

17. The system of claim 10, wherein the instructions for routing include instructions that when executed by the computer processor cause the computer processor to:
constraining routing of a clock signal, for each initial partition not having a congested region, to clock routing resources of clock regions within the partition; and
routing a clock signal, for the respective new partition, from the one of the clock sources to the associated subset of clock loads unconstrained by clock regions within the initial partition.

18. The system of claim 17, further comprising:
assigning clock signals to clock routing resources in clock regions of the IC; and
wherein the determining for each of the initial partitions, whether or not the partition has a congested clock region includes determining whether or not all clock routing resources in a region are assigned to clock signals.

* * * * *